(12) United States Patent
Kim

(10) Patent No.: US 8,027,653 B2
(45) Date of Patent: Sep. 27, 2011

(54) SIGNAL RECEIVING APPARATUS AND CONTROL METHOD THEREOF

(75) Inventor: Tae-hwan Kim, Hwaseong-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 699 days.

(21) Appl. No.: 12/128,090

(22) Filed: May 28, 2008

(65) Prior Publication Data

US 2009/0058572 A1  Mar. 5, 2009

(30) Foreign Application Priority Data

Aug. 28, 2007 (KR) .................. 10-2007-0086688

(51) Int. Cl.
*H04B 1/18* (2006.01)
*H04K 3/00* (2006.01)

(52) U.S. Cl. ................. 455/166.1; 348/731; 725/38

(58) Field of Classification Search .... 455/166.1–166.2, 455/167.1–180.2, 187.1; 348/731–732; 725/38, 725/59

See application file for complete search history.

(56) References Cited

U.S. PATENT DOCUMENTS 5,479,214 A * 12/1995 Sakakibara et al. .......... 348/558
2007/0149163 A1* 6/2007 Yasuta .......................... 455/348

FOREIGN PATENT DOCUMENTS

| DE | 102007006342 A1 | 8/2008 |
| EP | 1317073 A1 | 6/2003 |
| EP | 1337041 A1 | 8/2003 |
| JP | 2002118794 A | 4/2002 |
| JP | 2003333441 A | 11/2003 |
| KR | 10-2005-0069375 A | 7/2005 |

* cited by examiner

*Primary Examiner* — Lee Nguyen
(74) *Attorney, Agent, or Firm* — Sughrue Mion, PLLC

(57) ABSTRACT

A signal receiving apparatus includes: a tuning unit which has at least one tuner; a communication unit which communicates at least one external device; and a controller which divides an entire channel frequency band to be assigned to the tuning unit and a tunable device, and controls the tuning unit and the communication unit to tune the assigned channel frequency bands if the tunable device is present among the external devices.

15 Claims, 5 Drawing Sheets

FIG. 4

| OPCODE | VALUE | DESCRIPTION | PARAMETERS | PARAMETERS DESCRIPTION | RESPONSE | DIRECTLY ADDRESSED | BROADCAST |
|---|---|---|---|---|---|---|---|
| <VENDOR COMMAND> | 0x89 | ALLOWS VENDOR SPECIFIC COMMANDS TO BE SENT BETWEEN TWO DEVICES. | [VENDER SPECIFIC DATA] | VENDOR SPECIFIC COMMAND OR DATA. THE MAXIMUM LENGTH OF THE [VENDOR SPECIFIC DATA] SHALL NOT EXCEED 14 DATA BLOCKS TO AVOID SATURATING THE BUS. | VENDOR SPECIFIC. | ✓ | |

SIGNAL RECEIVING APPARATUS AND CONTROL METHOD THEREOF

CROSS-REFERENCE TO RELATED APPLICATION

This application claims priority from Korean Patent Application No. 10-2007-0086688, filed on Aug. 28, 2007, in the Korean Intellectual Property Office, the disclosure of which is incorporated herein by reference.

BACKGROUND OF THE INVENTION

1. Field of the Invention

Apparatuses and methods consistent with the present invention relate to a signal receiving apparatus and a control method thereof, and more particularly, to a signal receiving apparatus which tunes an entire channel frequency band to search a channel, and a control method thereof.

2. Description of the Related Art

Generally, a signal receiving apparatus includes a tuner which tunes a channel frequency to receive a broadcasting signal corresponding to a selected channel, and receives a broadcasting signal from a terrestrial broadcasting, cable broadcasting and satellite broadcasting stations.

The signal receiving apparatus may provide an automatic channel search function. In the automatic channel search function, the signal receiving apparatus tunes an entire searchable channel frequency band, and searches and sets a channel in the entire channel frequency band. Even if a user is not aware of a channel frequency, the signal receiving apparatus may automatically perform the channel search function to set all channels receiving broadcasting signals.

However, such a function has a weakness that it takes too much time to search the entire channel frequency band. That is, the more the channels are present, the longer it takes to search channels.

SUMMARY OF THE INVENTION

Accordingly, it is an aspect of the present invention to provide a signal receiving apparatus which searches all channels included in a channel frequency band within a shorter time, and a control method thereof.

Also, it is another aspect of the present invention to provide a signal receiving apparatus which assigns a part of an entire channel frequency band to a connected, external device having a tuner so that a plurality of tuners searches the assigned entire channel frequency band to reduce channel-searching time, and a control method thereof.

Additional aspects of the present invention will be set forth in part in the description which follows and, in part, will be obvious from the description, or may be learned by practice of the present invention.

The foregoing and/or other aspects of the present invention are also achieved by providing a signal receiving apparatus, comprising: a tuning unit which has at least one tuner; a communication unit which communicates at least one external device; and a controller which divides an entire channel frequency band to be assigned to the tuning unit and a tunable device, and controls the tuning unit and the communication unit to tune the assigned channel frequency bands if the tunable device is present among the external devices.

The signal receiving apparatus may further comprise a channel storage unit, wherein the controller stores channel information included in the entire channel frequency band tuned by the tuning unit and the tunable device, in the channel storage unit.

The signal receiving apparatus may further comprise a user input unit which is provided to select a channel search function tuning the entire channel frequency band, wherein the controller divides the entire channel frequency band to be assigned to the tuning unit and the tunable device, and controls the tuning unit and the tunable device to tune the assigned channel frequency bands if the channel search function is selected through the user input unit.

The controller may control the tuner of the tuning unit to tune the channel frequency corresponding to a channel, based on the channel information.

The communication unit may comprise an HDMI-CEC (high definition multimedia interface-consumer electronics control) port.

The controller may communicate with the external devices by using a preset protocol.

The foregoing and/or other aspects of the present invention are also achieved by providing a signal receiving apparatus, comprising: a communication unit which communicates with at least one external device; and a controller which divides an entire channel frequency band to be assigned to a plurality of tunable devices, and controls the communication unit to tune the assigned channel frequency bands if the tunable devices are present among the external devices.

The foregoing and/or other aspects of the present invention are also achieved by providing a signal receiving apparatus, comprising: a tuning unit which comprises at least one tuner; a communication unit which communicates with at least one external device; and a controller which controls the communication unit to tune a broadcasting signal different from a broadcasting signal tuned by the tuning unit, through a tunable device if the tunable device is present among the external devices.

The foregoing and/or other aspects of the present invention are also achieved by providing a control method of a signal receiving apparatus which has a tuning unit having at least one tuner, and a communication unit communicating with at least one external device, the control method comprising: determining whether a tunable device is present among the external devices; dividing an entire channel frequency band to be assigned to the tuning unit and the tunable device if the tunable device is present; and controlling the tuning unit and the communication unit to tune the assigned channel frequency bands.

The control method may further comprise storing channel information included in the entire channel frequency band tuned by the tuning unit and the tunable device.

The control method may further comprise selecting a channel search function by a user to tune the entire channel frequency band.

The control method may further comprise controlling the tuning unit to tune a channel frequency corresponding to a channel, based on the stored channel information.

The foregoing and/or other aspects of the present invention are also achieved by providing a control method of a signal receiving apparatus which has a tuning unit having at least one tuner and a communication unit communicating with at least one external device, the control method comprising: determining whether a tunable device is present among the external devices; and controlling the communication unit to tune a broadcasting signal different from a broadcasting signal tuned by the tuning unit, through the tunable device, if the tunable device is present.

BRIEF DESCRIPTION OF THE DRAWINGS

The above and/or other aspects of the present invention will become apparent and more readily appreciated from the following description of the embodiments, taken in conjunction with the accompanying drawings of which:

FIG. 4 illustrates a protocol of a communication unit according to the exemplary embodiment of the present invention.

DETAILED DESCRIPTION OF EXEMPLARY EMBODIMENT

Hereinafter, exemplary embodiments of the present invention will be described with reference to accompanying drawings, wherein like numerals refer to like elements and repetitive descriptions will be avoided as necessary.

Figure 1:
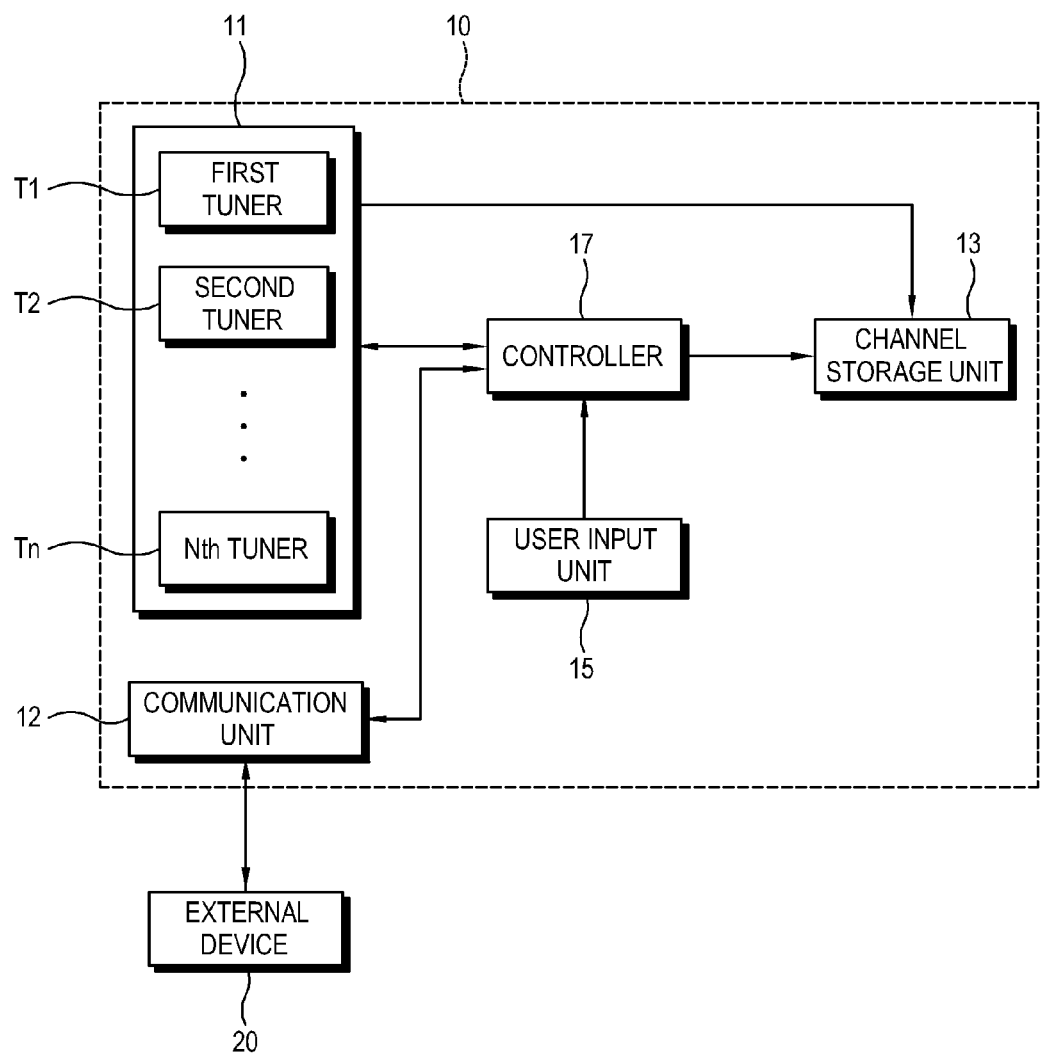
FIGS. 1 and 2 are block diagrams of a signal receiving apparatus according to an exemplary embodiment of the present invention.

FIG. 1 is a control block diagram of a signal receiving apparatus 10 according to a first exemplary embodiment of the present invention. As shown therein, the signal receiving apparatus 10 includes a tuning unit 11, a communication unit 12, a channel storage unit 13, a user input unit 15 and a controller 17.

The tuning unit 11 of the signal receiving apparatus according to the present invention tunes in an analog broadcasting signal or a digital broadcasting signal. The tuning unit 11 includes at least one tuner to tune in a channel frequency corresponding to a channel. The tuning unit 11 according to the present embodiment may include an N number of tuners, i.e., a first tuner $T_1$, a second tuner $T_2$, and an Nth tuner $T_N$.

The tuning unit 11 may include a demodulator to demodulate a tuned signal, a decoder, a multiplexer, etc. The tuning unit 11 tunes in a channel frequency corresponding to a tuning control signal of the controller 17 (to be described later), and receives a broadcasting signal. The tuner of the tuning unit 11 may include a multi tuner to receive both an analog broadcasting signal and a digital broadcasting signal.

If the broadcasting signal of the channel tuned in by the tuning unit 11 includes a digital broadcasting signal, it may be divided into a video signal, an audio signal and various data to be time-division multiplexed and packetized as a transport stream. For example, the demodulator may perform VSB demodulation and error correction with respect to the received broadcasting signal to output a transport stream.

The communication unit 12 is connected with at least one external device 20 to communicate with it. Here, the external device 20 may include a set-top box, an AV receiver, a DVD recorder, etc. The plurality of external devices 20 may be connected with the signal receiving apparatus 10 in series or in parallel.

Particularly, the communication unit 12 according to the present embodiment includes a High Definition Multimedia Interface-Consumer Electronics Control (HDMI-CEC) port for two-way communication, and may be connected and communicate with the external devices 20. The communication unit 12 according to the present invention may communicate with the external devices 20 by using a protocol as shown in FIG. 4. The protocol may be set during a manufacturing process of the signal receiving apparatus 10.

The user input unit 15 is provided to select a channel search function which searches for channels included in an entire channel frequency band. The user input unit 15 may include a menu key provided in a remote controller or a casing, and a key signal generator generating a key signal corresponding to key manipulation. The user input unit 15 may further include a number key and a direction key to select a channel, and a function key to select functions of the signal receiving apparatus 10.

The channel storage unit 13 stores therein channel information included in the entire channel frequency band tuned into by the plurality of tuners of the tuning unit 11. The channel storage unit 13 may include a memory such as an Electrically Erasable And Programmable Read Only Memory (EEPROM) (, a Non-Volatile Random Access Memory (NVRAM), etc. Here, the channel information stored in the channel storage unit 13 is referred to when the channel selected by a user is tuned into.

The controller 17 divides the entire channel frequency band to be assigned to the plurality of tuners of the tuning unit 11, and to a tunable device among the external devices 20, and controls the tuning unit 11 and the tunable device to tune in the assigned channel frequency bands. The controller 17 may include a CPU, a microcomputer, etc.

More specifically, the controller 17 according to the present embodiment determines whether there are plural tuners in the tuning unit 11 or whether the tunable device is present among the connected external devices 20 if channels are searched for, in the entire channel frequency band.

The controller 17 transmits a predetermined control signal to the communication unit 12 by using the protocol and determines that the external device 20 which transmits a response signal back to the controller 17 corresponding to the control signal, is the tunable device.

The controller 17 divides the entire channel frequency band corresponding to the number of the tuners of the tuning unit 11 and the number of the tunable devices. Then, the controller 17 assigns the divided channel frequency bands to the tuners and the tunable device to tune in the entire channel frequency band. Preferably, the controller 17 divides the entire channel frequency band into a number of bands corresponding to the number of the tuners of the tuning unit 11 and the number of the tunable devices.

If the tuning unit 11 and the tunable device tune in the assigned channel frequency bands and supply channel information on the discovered channels, the controller 17 stores the channel information in the channel storage unit 13. The controller 17 may update the channel information stored in the channel storage unit 13 whenever the tuning unit 11 and the tunable device supply the channel information.

Figure 2:
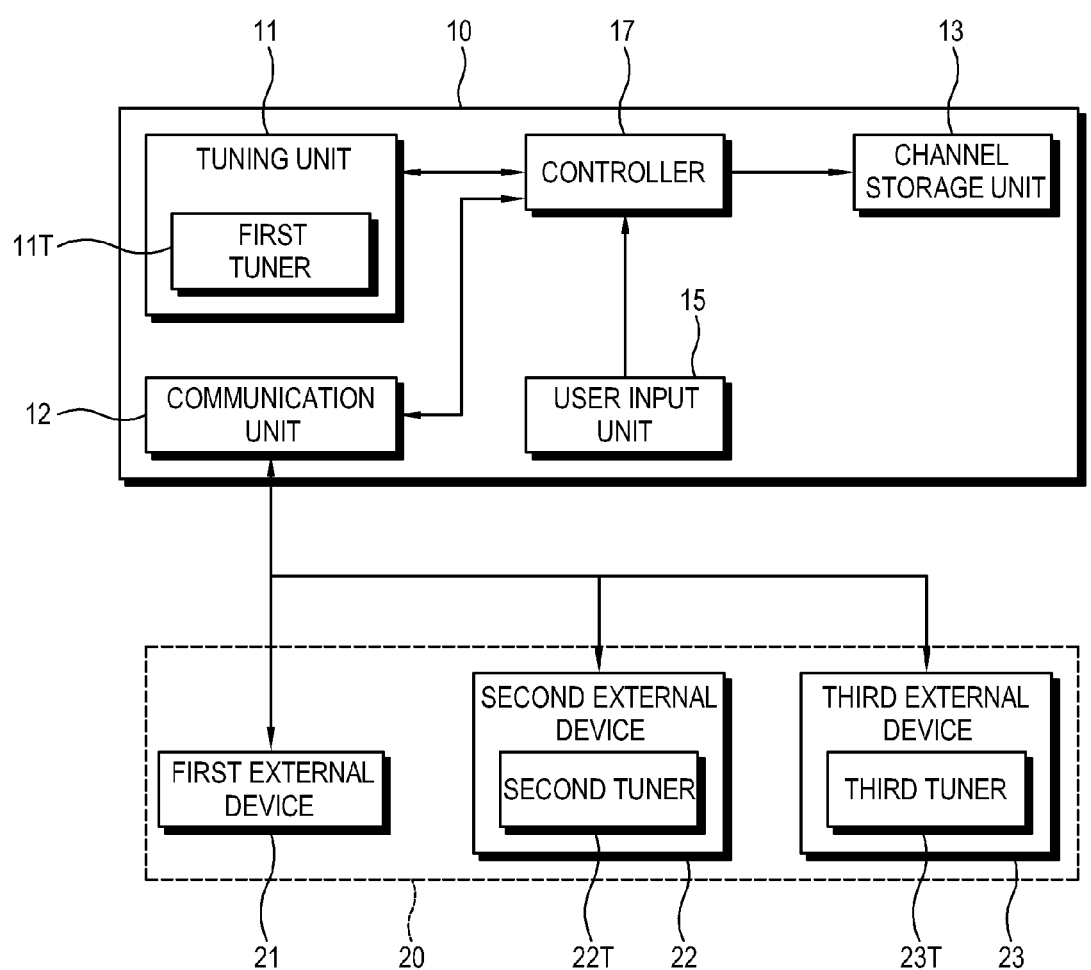

For example, referring to FIG. 2, assuming that the tuning unit 11 includes a single tuner, and a second external device 22 and a third external device 23 of the first to third external devices 21 to 23 connected through the communication unit 12 are the tunable devices.

Figure 3:
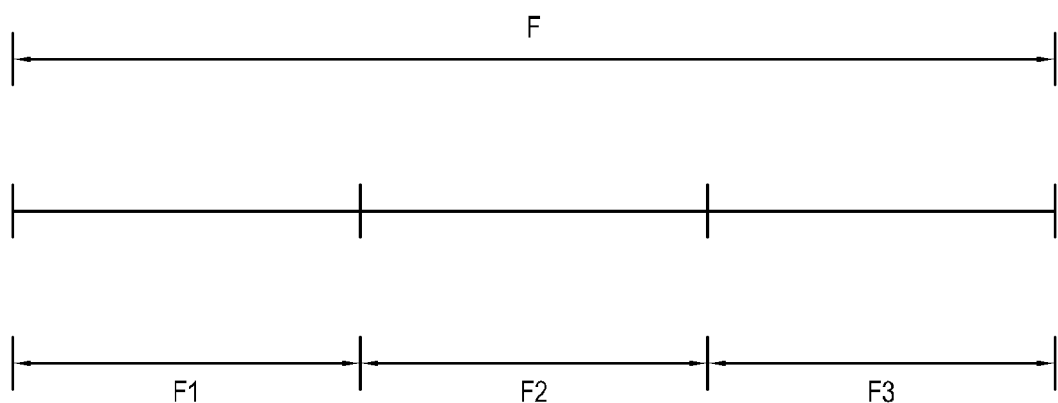
FIG. 3 illustrates an assignment of an entire channel frequency band according to the exemplary embodiment of the present invention.

As shown in FIG. 3, the controller 17 divides the entire channel frequency band F into three channel frequency bands F1, F2 and F3. The first channel frequency band F1 of the divided channel frequency bands F1, F2 and F3 is assigned to the first tuner 11T of the tuning unit 11, the second channel frequency band F2 is assigned to the second tuner 22T of the second external device 22, and the third channel frequency band F3 is assigned to the third tuner 23T of the third external device 23. The controller 17 controls the first tuner 11T, the second tuner 22T and the third tuner 23T to tune in the first channel frequency band F1, the second channel frequency band F2 and the third channel frequency band F3, respectively, and search for channels in the first to third channel frequency bands F1 to F3.

If the first tuner 11T tunes in the first channel frequency band F1 and supplies first channel information on the channels found, the controller 17 stores the first channel information in the channel storage unit 13. Likewise, if the second tuner 22T and the third tuner 23T supply the second channel information of the second channel frequency band F2 and the third channel information of the third channel frequency band F3, respectively, the controller 17 stores the second and third channel information in the channel storage unit 13.

If a user selects a channel, the controller 17 may check the channel information stored in the channel storage unit 13, and control one of the plurality of tuners of the tuning unit 11 to tune in the selected channel.

If the channel search function is selected through the user input unit 15 or if the signal receiving apparatus 10 is initially turned on, the controller 17 may divide the entire channel frequency band to be assigned to the plurality of tuners and control the tuning unit 11 to tune in the assigned channel frequency bands.

Figure 5:
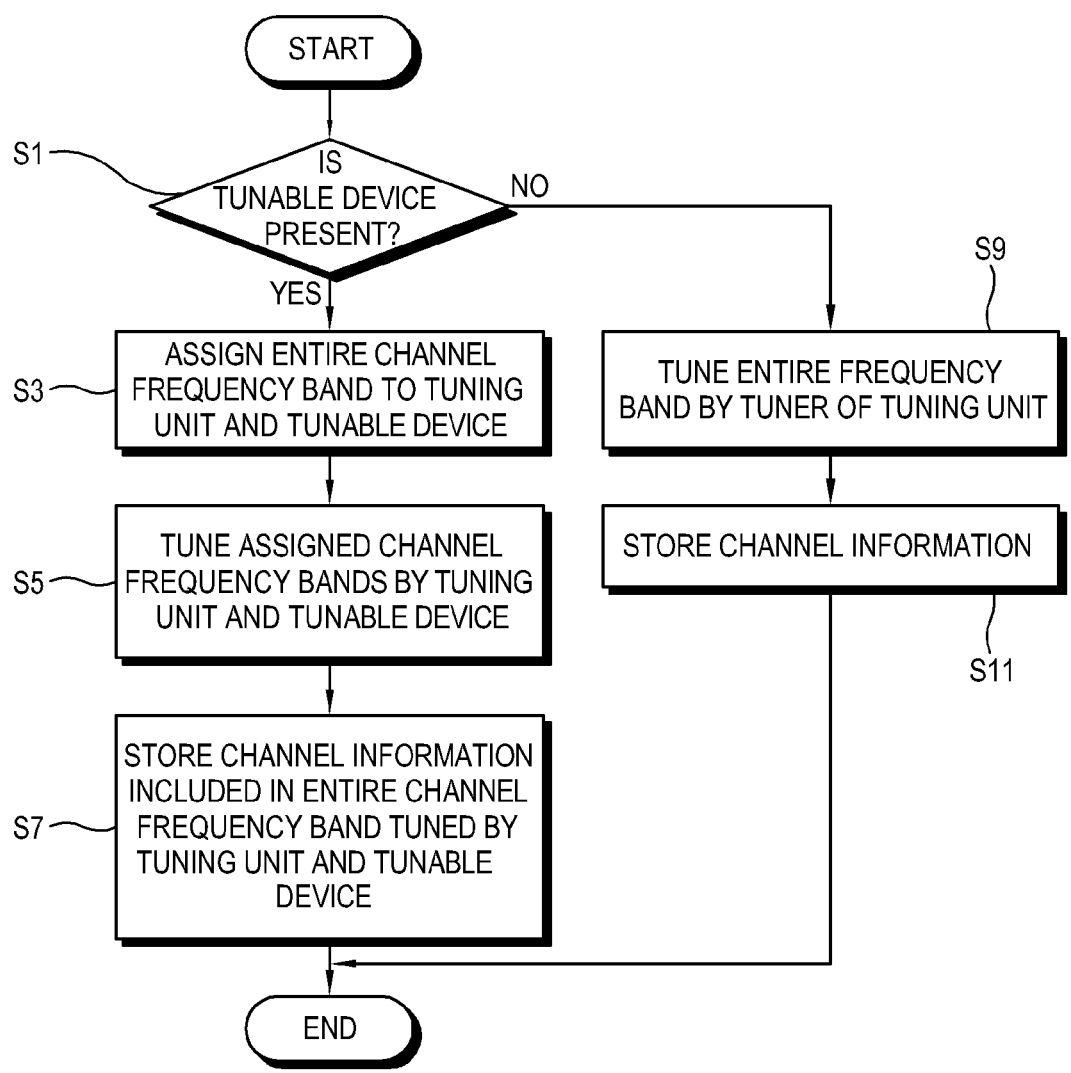
FIG. 5 is a flowchart to describe a control method of the signal receiving apparatus according to the exemplary embodiment of the present invention.

Hereinafter, a control method of the signal receiving apparatus 10 according to the exemplary embodiment of the present invention will be described with reference to FIG. 5.

As shown therein, the controller 17 determines whether the tunable device is present among the external devices 20 (S1).

As described above, if the channel search function is selected through the user input unit 15 or if the signal receiving apparatus 10 is initially turned on, the controller 17 checks the tuners and the tunable device to search for channels from the entire channel frequency band. If it is determined at operation S1 that the tunable device is present, the controller 17 divides the entire channel frequency band into the number of the tuners of the tuning unit 11 and the tunable device, and assigns the divided channel frequency bands to the plurality of tuners and the tunable device (S3).

The controller 17 controls the tuning unit 11 and the tunable device to tune in the assigned channel frequency bands (S5), and stores the channel information included in the entire channel frequency band tuned into by the tuning unit 11 and the tunable device, in the channel storage unit 13 (S7).

If it is determined at operation S1 that the tunable device is not present, the controller 17 divides and assigns the entire channel frequency band corresponding to the number of the tuners of the tuning unit 11 and controls the tuning unit 11 to tune in the channel frequency band (S9). The controller 17 then stores the searched channel information in the channel storage unit 13 (S11).

If the tunable device is present among the connected external devices 20, the tuners and the tunable device search the channel from the entire channel frequency band, thereby reducing time to tune in the entire channel frequency band. The more the tuners of the tuning unit 11 and the tunable device are, the shorter it takes to tune in the channel frequency band.

Second Exemplary Embodiment

Hereinafter, a signal receiving apparatus according to a second exemplary embodiment of the present invention will be described in detail. Repetitive descriptions will be omitted or briefly provided.

According to the first exemplary embodiment of the present invention, the entire channel frequency band is divided to be assigned to the tuning unit 11 and the tunable device. Meanwhile, according to the second exemplary embodiment, the entire channel frequency band is divided and assigned to at least one tunable device connected to a communication unit 12.

That is, a controller 17 determines whether there are plural tunable devices, and divides the entire channel frequency band corresponding to the number of the tunable devices. Then, the controller 17 assigns the divided channel frequency bands to the plurality of tunable devices. The controller 17 controls the plurality of tunable devices to tune in the entire channel frequency band and search for channels in the channel frequency band.

Even if the signal receiving apparatus 10 does not include a tuner, it may perform a channel search function or may tune in a channel by using a connected tunable device.

Third Exemplary Embodiment

Hereinafter, a signal receiving apparatus 10 according to the third exemplary embodiment of the present invention will be described. Repetitive descriptions will be omitted.

According to the first and second exemplary embodiments, the entire channel frequency band is divided into the number of the tuners of the tuning unit 11 and the tunable device. Meanwhile, according to the third exemplary embodiment, the tuning unit 11 and the tunable device are assigned with the channel frequency band to tune in different kinds of broadcasting signals, respectively.

That is, a controller 17 determines the type of the broadcasting signal tuned into by the tuning unit 11. Then, the controller 17 controls a communication unit 12 to tune in a broadcasting signal, different from a broadcasting signal tuned into by the tuning unit 11, by the tunable device.

Referring to FIG. 2, assuming that a first tuner 11T of the tuning unit 11 tunes in a digital broadcasting signal. The controller 17 may control a second tuner 22T of a second external device 22 to tune in an analog broadcasting signal, and control a third tuner 23T of a third external device 23 to tune in a cable broadcasting signal.

As the tuner and the tunable device tune in different types of broadcasting signals, the time to tune in different kinds of broadcasting signals may be reduced.

As described above, the present invention provides a signal receiving apparatus which assigns a part of an entire channel frequency band to a connected, tunable external device, and reduces time to search a channel from the entire channel frequency band, and a control method thereof.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A signal receiving apparatus comprising:
a tuning unit comprising a tuner;
a communication unit which communicates with at least one external device; and
a controller which divides a channel frequency band into a first band and a second band, and controls the tuning unit and the communication unit to tune in the first and the second bands, respectively, if a tunable device is present among the at least one external device.

2. The signal receiving apparatus according to claim 1, further comprising a channel storage unit, wherein the controller stores channel information included in the first and the second bands respectively tuned into by the tuning unit and the tunable device, in the channel storage unit.

3. The signal receiving apparatus according to claim 2, further comprising a user input unit which is provided to select a channel search function which tunes into the channel frequency band, wherein
the controller controls the tuning unit and the tunable device to tune into the first and the second bands if the channel search function is selected through the user input unit.

4. The signal receiving apparatus according to claim 2, wherein the controller controls the tuner of the tuning unit to tune in a channel frequency corresponding to a channel, based on the channel information.

5. The signal receiving apparatus according to claim 1, wherein the communication unit comprises a High Definition Multimedia Interface-Consumer Electronics Control (HDMI-CEC) port.

6. The signal receiving apparatus according to claim 5, wherein the controller communicates with the at least one external device by using a protocol.

7. A signal receiving apparatus according to claim 1, wherein the controller determines how many external devices are included in the plurality of external devices, and divides the channel frequency band into a number of sub-bands equal to a number of external devices included in the plurality of external devices.

8. A signal receiving apparatus, comprising:
a communication unit which communicates with a plurality of external devices; and
a controller which divides a channel frequency band into plural bands, and controls the communication unit to tune in the plural bands if tunable devices are present among the plurality of external devices.

9. A signal receiving apparatus according to claim 8, wherein the controller determines how many external devices are included in the plurality of external devices, and divides the channel frequency band into a number of sub-bands equal to a number of external devices included in the plurality of external devices.

10. A signal receiving apparatus, comprising:
a tuning unit comprising a tuner;
a communication unit which communicates with at least one external device; and
a controller which controls the communication unit to tune in a broadcasting signal different from a broadcasting signal tuned into by the tuning unit, through a tunable device if the tunable device is present among the at least one external device.

11. A control method of a signal receiving apparatus which includes a tuning unit including at least one tuner, and a communication unit communicating with at least one external device, the control method comprising:
determining whether a tunable device is present among the at least one external device;
dividing a channel frequency band into plural bands if the tunable device is present; and
controlling the tuning unit and the communication unit to tune in the plural bands.

12. The control method according to claim 11, further comprising storing channel information included in the channel frequency band tuned into by the tuning unit and the tunable device.

13. The control method according to claim 12, further comprising selecting a channel search function by a user to tune in the channel frequency band.

14. The control method according to claim 12, further comprising controlling the tuning unit to tune in a channel frequency corresponding to a channel, based on the stored channel information.

15. A control method of a signal receiving apparatus which includes a tuning unit including at least one tuner and a communication unit communicating with at least one external device, the control method comprising:
determining whether a tunable device is present among the at least one external device; and
controlling the communication unit to tune in a broadcasting signal different from a broadcasting signal tuned into by the tuning unit, through the tunable device, if the tunable device is present.

* * * * *